United States Patent
Desai et al.

(10) Patent No.: US 7,119,432 B2
(45) Date of Patent: Oct. 10, 2006

(54) METHOD AND APPARATUS FOR ESTABLISHING IMPROVED THERMAL COMMUNICATION BETWEEN A DIE AND A HEATSPREADER IN A SEMICONDUCTOR PACKAGE

(75) Inventors: Kishor V. Desai, Fremont, CA (US); Maniam B. Alagaratnam, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/820,494

(22) Filed: Apr. 7, 2004

(65) Prior Publication Data

US 2005/0224955 A1    Oct. 13, 2005

(51) Int. Cl.
  *H01L 21/48* (2006.01)
  *H01L 23/34* (2006.01)
(52) U.S. Cl. ............... 257/706; 257/707; 438/125
(58) Field of Classification Search ........... 257/712, 257/703, 706, 717
  See application file for complete search history.

(56) References Cited

U.S. PATENT DOCUMENTS

| | | | |
|---|---|---|---|
| 6,432,497 B1 * | 8/2002 | Bunyan | 428/40.1 |
| 6,657,864 B1 * | 12/2003 | Dyckman et al. | 361/704 |
| 6,716,676 B1 * | 4/2004 | Chen et al. | 438/122 |
| 6,873,043 B1 * | 3/2005 | Oman | 257/703 |
| 6,906,416 B1 * | 6/2005 | Karnezos | 257/723 |
| 2003/0234453 A1 * | 12/2003 | Liu et al. | 257/778 |
| 2004/0188503 A1 * | 9/2004 | Hua | 228/254 |
| 2005/0218426 A1 * | 10/2005 | Kobayashi et al. | 257/177 |

FOREIGN PATENT DOCUMENTS

DE        4335800      * 4/1994

* cited by examiner

Primary Examiner—Nathan J. Flynn
Assistant Examiner—Ahmed N. Sefer
(74) Attorney, Agent, or Firm—Beyer, Weaver & Thomas

(57) ABSTRACT

A semiconductor package comprising a packaging substrate, a semiconductor die mounted with the substrate, a heatspreader, and a multi-layer heat transfer element arranged between the semiconductor die and the heat spreader to enable thermal communication between the die and the heat spreader is disclosed. The multi-layer heat transfer element includes a core spacer element sandwiched between a first layer of thermally conductive reflowable material and a second layer of thermally conductive reflowable material. Also disclosed are methods for forming such semiconductor packages and for forming multilayer heat transfer elements.

15 Claims, 3 Drawing Sheets

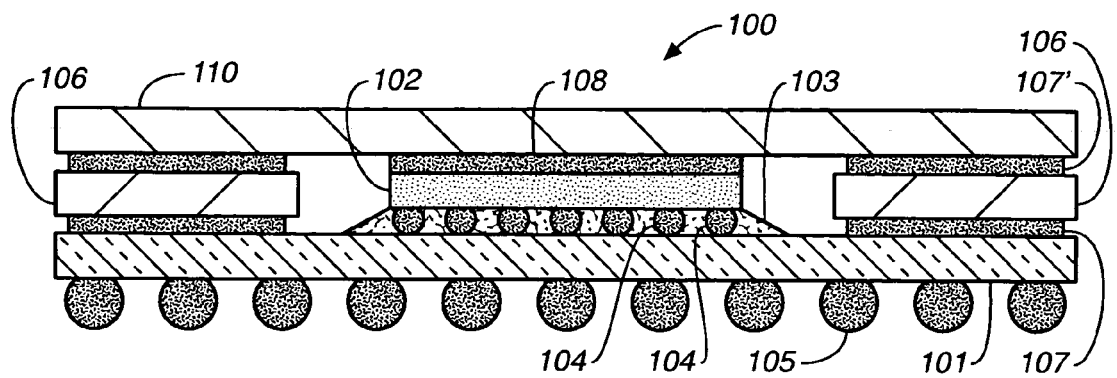
FIG._1
*(PRIOR ART)*
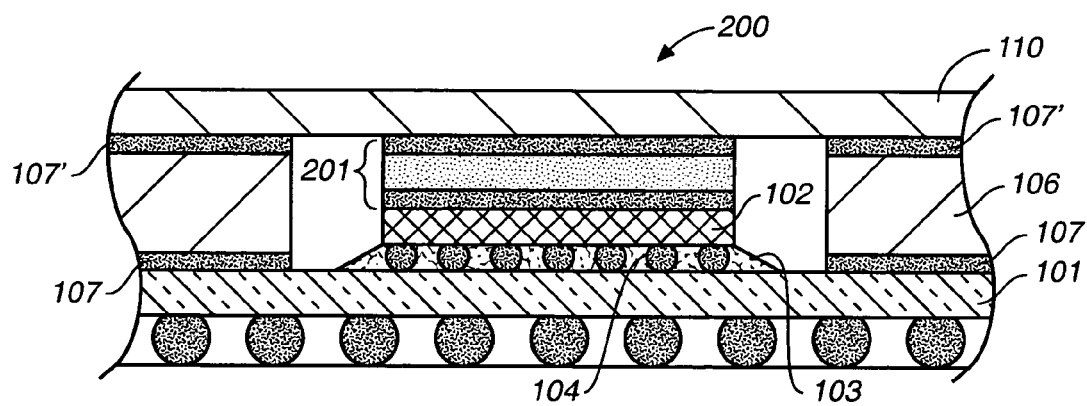
FIG._2a
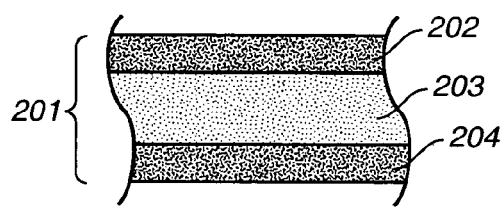
FIG._2b

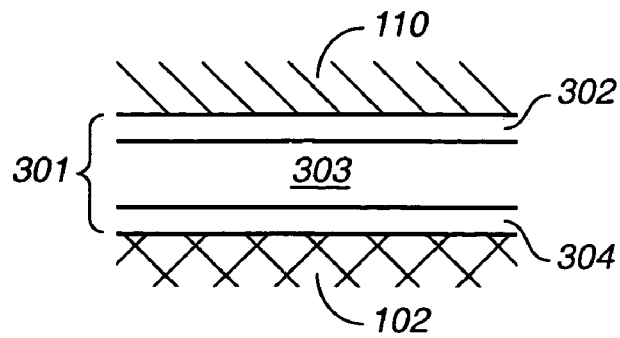
FIG._3a
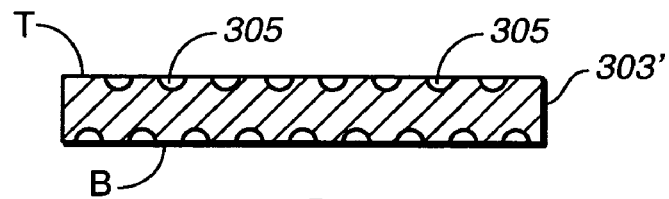
FIG._3b
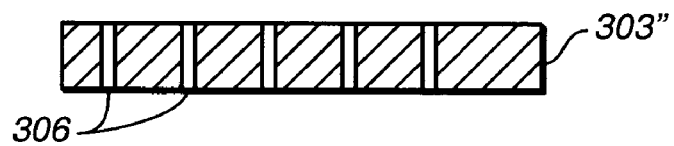
FIG._3c
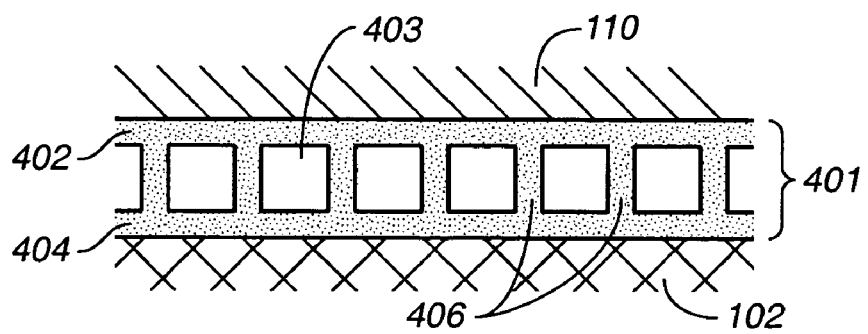
FIG._4

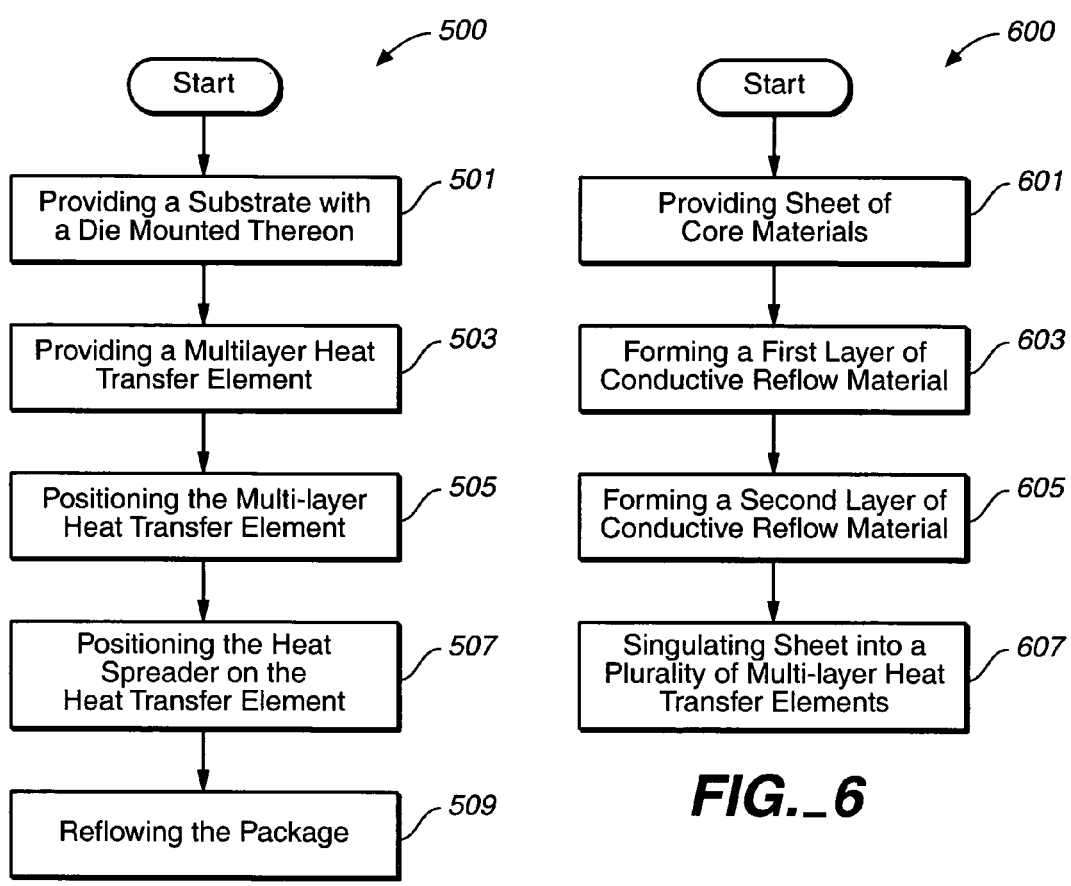

METHOD AND APPARATUS FOR ESTABLISHING IMPROVED THERMAL COMMUNICATION BETWEEN A DIE AND A HEATSPREADER IN A SEMICONDUCTOR PACKAGE

TECHNICAL FIELD

The invention described herein relates generally to semiconductor packaging. In particular, the invention relates to a method and apparatus for providing improved thermal communication between a die and a heat spreader in a semiconductor integrated circuit package.

BACKGROUND

In semiconductor packaging, care must be taken to insure that heat generated by a semiconductor die can be adequately dissipated. Commonly, the die of a semiconductor device is mated with a heat spreader to conduct heat away from the die. Typically, the heat spreader operates as a heat sink to dissipate heat from the die. In some implementations, a finned heat sink is cemented to the heat spreader to enhance the heat dissipation properties of the heat spreader.

FIG. 1 illustrates a commonly employed structure for a semiconductor package design. The depicted illustration is a cross-section view of a commonly employed implementation of a conventional semiconductor package 100. In the depicted structure, a semiconductor die 102 is mounted with a packaging substrate 101. Commonly, solder bumps 104 are subject to a reflow process to physically attach and electrically connect the die 102 with the substrate 101. Additionally, the die 102 is further secured to the substrate 101 by underfilling the die 102 with an encapsulant material 103.

Additionally, the package is commonly stiffened by the attachment (or formation of) of a stiffener 106 to the substrate 101. Frequently, the stiffener is attached using an adhesive 107. Such adhesives commonly comprise epoxies, but may also consist of numerous other adhesive materials that are commonly used for such purposes. Such materials are known to persons having ordinary skill in the art. Additionally, in some approaches, a stiffener 106 can formed by depositing stiffener materials (e.g., metals) directly on the substrate 101. Generally, although not exclusively, the stiffener 106 runs around the entire edge of the substrate 101 encircling the entire die 102.

A heat spreader 110 is then attached to the "top" of the package. Commonly, the heat spreader 110 is secured to the package using another layer of adhesive 107' on top of the stiffener 106. The adhesive 107' affixes the heat spreader 110 to the stiffener 106. Importantly, thermal contact between the heat spreader 110 and the die 102 is facilitated by the presence of a layer 108 of heat conducting thermal transfer material. Typically, such thermal transfer material has been, until recently, comprised of a resin based material with a conductive filler. Examples include organic resins having metal fillers. However, with increasing processor speed (and therefore increasing die temperatures) come a need for increased cooling efficiency for die packages. In general, this means that it is desirable to improve the heat conduction between the die 102 and the heat spreader 110. Although suitable for many implementations, the present resin based thermal transfer materials can be improved.

In one approach, designers have sought to replace the present resin based thermal transfer materials with solder materials. Such solder materials have better thermal conductivity and so in some ways are a superior choice. However, such solder layers have their own limitations. For example, in many implementations the space between the die 102 and the heat spreader 110 can be in the range of 30 to 250 microns (μm). It has been discovered that current techniques of solder layer formation have difficulties reliably and uniformly depositing or coating surfaces to form a solder layer of such thickness. Some techniques can require that many layers of solder are formed, one over the other in order to establish solder layers of appropriate thickness. Additionally, solder layers are adhered to the heat spreader 110 and the top of the die 102 using reflow processes. If a thick solder layer 108 is used, the reflow process can cause pooling of the solder to create unevenness in the solder layer. This unevenness can prevent good thermal contact between the heat spreader 110 and the die 102. Additionally, these excessively thick solder layers can overflow and excess solder can be "squeezed" out of the space between the die 102 and the heat spreader 110. Such excess solder can overflow onto conductors or cause heat related damage to portions of the package 100. Thus, for these and other reasons, improved structures and methodologies for establishing good thermal transfer between a die and heat spreader are desired. The principles of the present invention are directed toward methods and apparatus for constructing and implementing improved multi-layer heat transfer elements.

SUMMARY

In accordance with the principles of the present invention, the invention includes structures and methodology for forming improved semiconductor packages including a multi-layer heat transfer element. Additionally, method embodiments for forming such multilayer heat transfer elements are also disclosed.

In one embodiment, the invention includes a semiconductor package comprising a packaging substrate, a semiconductor die mounted with the substrate, a heatspreader, and a multi-layer heat transfer element arranged between the semiconductor die and the heat spreader to enable thermal communication between the die and the heat spreader.

In another embodiment, the invention includes a semiconductor package comprising a packaging substrate and a semiconductor die mounted with the substrate. The package also includes a heat spreader and a multi-layer heat transfer element arranged between the semiconductor die and the heat spreader. The multi-layer heat transfer element includes a core spacer element having a top surface and a bottom surface. The top surface includes a first layer of thermally conductive reflowable material formed thereon and the bottom layer includes a second layer of thermally conductive reflowable material formed thereon.

In another embodiment, the invention comprises a method for forming a semiconductor package. The method provides a semiconductor substrate with a semiconductor die mounted thereon. The method provides a multilayer heat transfer element that having a core with a first layer of thermally conductive reflowable material formed on top of the core and a second layer of thermally conductive reflowable material formed on the bottom of the core. The multi-layer heat transfer element is positioned between the die and the heatspreader is positioned on the multilayer heat transfer element. A further embodiment involves reflowing the above described semiconductor package to adhere the thermally conductive reflowable material of the first layer of the multilayer heat transfer element with the heatspreader and to adhere the thermally conductive reflowable material of the second layer of the multilayer thermal transfer heat conductor with the die thereby establishing thermal communication between the die and heat spreader.

Another embodiment describes methods for forming multilayer heat transfer elements in accordance with the principles of the invention. The method involves providing a plate of core material. And forming a first layer comprised of thermally conductive reflowable material on the top surface of the core material. And forming a second layer of thermally conductive reflowable material on the bottom surface of the core material. The plate is singulated into a plurality of multilayer heat transfer elements.

These and other aspects of the invention will be disclosed in greater detail in the following detailed description.

BRIEF DESCRIPTION OF THE DRAWINGS

The following detailed description will be more readily understood in conjunction with the accompanying drawings, in which:

FIG. 1 is a simplified figurative depiction of a conventional semiconductor package for an integrated circuit (IC).

FIGS. 2(a) and 2(b) are a simplified schematic cross-sectional views of semiconductor package embodiment constructed in accordance with the principles of the present invention.

FIG. 3(a) is a simplified schematic cross-sectional view of a portion of a semiconductor package embodiment constructed in accordance with the principles of the present invention FIGS. 3(b) and 3(c) are simplified schematic cross-sectional views of a core portion embodiment for a multi-layer heat transfer element constructed in accordance with the principles of the present invention.

FIG. 4 is a simplified schematic cross-sectional view of a core portion embodiment for a multi-layer heat transfer element constructed in accordance with the principles of the present invention.

FIG. 5 is a flow diagram disclosing one a method embodiment for constructing a semiconductor package embodiment in accordance with the principles of the present invention.

FIG. 6 is a flow diagram disclosing one a method embodiment for constructing a plurality of multi-layer heat transfer elements in accordance with the principles of the present invention.

It is to be understood that in the drawings like reference numerals designate like structural elements. Also, it is understood that the depictions in the drawings are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Embodiments of the present invention are directed to methods of constructing and implementing a multi-layer heat transfer elements. In particular, some embodiments are directed to semiconductor packages having a multi-layer heat transfer element arranged between the semiconductor die and the heat spreader to enable thermal communication between the die and the heat spreader. In such structures, a multi-layer heat transfer element includes layers of reflowable conductive materials arranged to provide good thermal contact between a die and an associated heat spreader. Several embodiments of such arrangements are discussed hereinbelow. Moreover, methods of constructing and implementing such a multi-layer heat transfer elements are disclosed herein.

FIGS. 2(a) and 2(b) are simplified schematic cross-section views of one embodiment of the invention. The embodiment illustrated in FIG. 2(a) depicts a portion of a typical implementation of a semiconductor package 200 constructed in accordance with the principles of the invention. Such embodiments can be used to form strong multilayer thermal transfer structures that have thin layers of solder or other thermally conductive reflow materials and thereby operate as an efficient heat transfer media. In the depicted structure, a semiconductor die 102 is mounted with a packaging substrate 101. Typically, the semiconductor die 102 is attached to a packaging substrate 101 using solder bumps 104 are subject to a reflow process to physically attach and electrically connect the die 102 with the substrate 101. Additionally, the die 102 can be further secured to the substrate 101 by underfilling the die 102 with an encapsulant material 103.

Additionally, the package can be stiffened by the attachment (or formation of) of a stiffener 106 to the substrate 101. Frequently, the stiffener is attached using an adhesive 107. As previously discussed, such adhesives commonly comprise epoxies, but may also consist of numerous other adhesive materials that are known to those having ordinary skill in the art. Alternatively, stiffeners 106 can be formed by depositing stiffening materials (e.g., metals) directly on the substrate 101. A stiffener 106 can (but, is not required to) circle the entire edge of the substrate 101 encircling the entire die 102. A heat spreader 110 is attached to the "top" of the package. Commonly, the heat spreader 110 is secured to the package using another layer of adhesive 107' on top of the stiffener 106.

In the depicted embodiment, thermal contact between the heat spreader 110 and the die 102 is facilitated by the presence of a layer 108 of a multi-layer heat transfer element 201 configured to facilitate the transfer of heat from the die 102 to the heat spreader 110.

FIG. 2(b) is a closer view of the embodiment of the multi-layer heat transfer element 201 depicted in FIG. 2(a). The multi-layer heat transfer element 201 includes a first layer 201 of reflowable conducting material arranged on a top surface of a plate or layer of core 203 material. The multi-layer heat transfer element 201 also includes a second layer 203 of reflowable conducting material arranged on a bottom surface of the core 203 material. The core 203 can be conducting or non-conducting depending on the implementation. Details of a number of embodiments will be discussed in detail hereinbelow. As used herein, reflowable materials are those materials, that when subjected to the right temperature, undergo a controllable liquefaction that allows the material to flow in a more liquefied state. Common examples include, but are not limited to, solder materials or metals which flow at relatively low process temperatures. In the present invention, such reflowable materials should also be conducting materials. Again, solder materials or metals which flow at relatively low process temperatures are particularly well suited to the principles of the invention. Specific examples include, but are not limited to, lead-free alloy solders (e.g, SiTi (silicon titanium containing solders), AgCu (silver copper containing solders), SnAg (tin silver containing solders), SnBi (tin bismuth containing solders), as well as many others); lead containing solders, or even Sn or Ag solders. The inventors specifically point out that the above listed solders and metals are examples only. The invention is intended to cover the entire range of solder materials available to one of ordinary skill in the art. Additionally, the inventors contemplate that different solder materials can be used in each layer (202, 204). In one embodiment, a first solder layer 202 can be selected of a material that has good bonding adhesion to the materials of the heat spreader 110. Also, the second solder layer 204 can be selected of a material that has good bonding adhesion to the materials forming the contact portion of the die 102.

FIG. 3(*a*) depicts one embodiment of a multi-layer heat transfer element 301 constructed in accordance with the principles of the invention. Such embodiment can be implemented, for example, in place of 201 in FIG. 2(*a*). In this embodiment, the multi-layer heat transfer element 301 comprises a thermally conductive core 303 sandwiched between layers 302, 304 of thermally conductive reflow material. The thermally conductive core 303 can be comprised of a number of different thermally conductive structures. In one embodiment, the core 303 is comprised of highly thermally conductive materials that can include, but are not limited to, metals, metal alloys, and layered metal structures. Such layered metal structures can be laminated metallic structures. Metal layer embodiments can also be treated with surface coatings as well. For example, a core can comprise a copper material having a nickel coating on the top surface and a nickel layer on the bottom surface. Embodiments of the thermally conducting core 303 can include a wide range of materials. A non-limiting list of examples includes, copper, copper alloys, nickel iron (NiFe) alloys, aluminum, and many other thermally conducting metal materials known to persons having ordinary skill in the art.

Additionally, the conducting core 303 can include, but is not limited to, a thermally a thermally enhanced resin material. Such enhanced resin materials can include conductive filler materials. One such example comprises a BT (bismaleimide-triazine) resin having a fine aluminum powder dispersed therein. Other alternatives include, but are not limited to, ceramics and the like treated to enhance thermal conductivity. All of the previously discussed core materials are thermally conductive and do not deform at reflow temperatures. This creates a solid conductive base upon which layers of thermally conductive reflow materials can be formed.

Such thermally conductive cores 303 further include layers 302, 304 of thermally conductive reflow materials. In the depicted embodiment, a first layer 302 of thermally conducting reflowable material is formed on a top surface of a conductive core 303 material. A second layer 304 of thermally conducting reflowable material is formed on a bottom surface of the conductive core 303. These layers 302, 304 of thermally conducting reflowable material can be formed using a number of different thermally conductive materials. Solder materials are particularly suitable as are many other reflowable thermally conductive materials. Additionally, these layers 302, 304 of thermally conducting reflowable material can be formed using a number of different processes known to persons having ordinary skill in the art. For example, the thermally conducting reflowable material can be screen printed onto the core 303. In another embodiment, the layers 302, 304 can be formed using HASL (Hot Air Solder Level) processes. Additionally, many different deposition processes can be used to form suitable layers 302, 304 of thermally conductive reflowable material on the core 303. Typically, multi-layer heat transfer element 301 embodiments range in thickness from about 15 μm to about 250 μm thick. Other embodiments range in thickness from about 50 μm to about 200 μm thick. In one example embodiment, the first layer 302 can be formed about 1 μm to about 10 μm thick (e.g., 7.5 μm thick) on a core about 15 μm thick. Also, the second layer 304 can be formed on the other side of the core 303 to a thickness of in the range of about 1 μm to about 10 μm thick (e.g., 7.5 μm thick). In one particular embodiment, a copper core 303 of about 15 μm thick is sandwiched between two tin (Sn) solder layers 302, 304 of about 7.5 μm thick each.

As previously indicated, the first layer 302 is in thermal communication with both the heat spreader 110 and the core 303. Also, the second layer 304 is in thermal communication with both the die 102 and the conductive core 303. Such thermal communication is generally established by physical contact by the reflowable layers 302, 304 with the core and either the die 102 or the heat spreader 110. In one example, such physical contact is facilitated by subjecting the reflowable layers 302, 304 to a reflow process. Such process obtains good physical contact between the reflow layers 302, 304 and the die 102 and the heat spreader 110.

In some alternative embodiments, a core can be constructed having a plurality of depressions in the surface or constructed having a plurality of holes (vias) that penetrate through the surfaces of the core. Examples of such embodiments are depicted in the simplified schematic depicts on of FIGS. 3(*b*) and 3(*c*). In FIG. 3(*b*), a thermally conductive core 303' is depicted having depressions (dimples) 305 in the surfaces T, B. In some embodiments, the presence of such dimples 305 can prevent excess solder (or other thermally conductive reflowable material) from overflowing and being squeezed out of the sides during assembly processes. In FIG. 3(*c*), a thermally conductive core 303" is depicted having vias 306 that penetrate through the core 303" and have openings in both surfaces of the core 303". In some embodiments, the presence of such vias 306 can prevent excess solder (or other thermally conductive reflowable material) from overflowing and being squeezed out of the sides during assembly processes. Also, in other embodiments, a thermally conductive reflowable material (e.g., solder) having a higher thermal conductivity than the core 303" material can be used. Thus, when such one layer of the thermally conductive reflowable material is reflowed into the vias it can physically (and thermally) contact the thermally conductive reflowable material of the layer on the other side of the core 303" to enhance the overall thermal conductivity of the structure. The inventors specifically point out that the depicted embodiments are merely illustrative of the more general principles of the invention and are not intended to limit the scope of the invention. Particularly, the invention is not to be construed as being confined to the depicted embodiments.

FIG. 4 is a simplified schematic depiction of another embodiment constructed in accordance with the principles of the invention. FIG. 4 depicts one embodiment of a multi-layer heat transfer element 401 constructed in accordance with the principles of the invention. Such embodiment can be implemented, for example, in place of 201 in FIG. 2(*a*) or 301 in FIG. 3(*a*). In this embodiment, the multi-layer heat transfer element 401 comprises a core 403 element that may not be very thermally conductive. Such cores 403 can even be thermally insulative. However, in the most preferred embodiments, such cores have at least moderate thermal conductivity. Such materials can include BT resins having thermally conductive fillers as well as ceramics having such fillers. In many respects, the design and use of such multilayer heat transfer element 401 is analogous to the embodiment discussed in FIG. 3(*c*). A core 403 is sandwiched between layers 402, 404 of thermally conductive reflow material. The core materials should not deform at reflow temperatures and should create a solid base upon which layers of thermally conductive reflow materials can be formed. The depicted core 403 includes a plurality of vias 406 that penetrate through the core 403 and have openings in both surfaces of the core 403. The presence of these vias 406 can prevent excess solder (or other thermally conductive reflowable material) from overflowing and being squeezed out of the sides during assembly processes. However, more importantly, in embodiments where the thermal conductivity of the core 403 is relatively poor, the layers 402, 404 of thermally conductive reflowable material (e.g., solder) have a higher thermally conductivity than the core 403 material. Additionally, the layers 402, 404 are in physical contact through the vias 406. This physical contact established thermal communication between the layers 402, 404. Such thermal communication enables heat to flow from the die 102 into the second layer 404 through the vias 406 into first layer 402 and into heat spreader 110 where it can be dissipated. Thus, a strong, multilayer thermal transfer structure having thin layers of solder or other thermally conductive reflow materials can be formed. As discussed above, layers 402, 404 of can be constructed of thermally conductive reflow materials. Also as before, solder materials of the type discussed above are particularly suitable, as are many other reflowable thermally conductive materials. These layers 402, 404 of thermally conducting reflowable material can be formed using any of a number of previously discussed methods as well as a number of other processes known to persons having ordinary skill in the art. In one embodiment, a BT core 403 of about 15 µm thick is sandwiched between two tin (Sn) solder layers 402, 404 of about 7.5 µm thick each.

The inventors specifically point out that the depicted embodiments are merely illustrative of the more general principles of the invention and are not intended to limit the scope of the invention. Particularly, the invention is not to be construed as being confined to the depicted embodiments.

FIG. 5 is a flow diagram 500 illustrating a simplified method embodiment used for forming a semiconductor package in accordance with an embodiment of the invention. The method involves providing a packaging substrate having a semiconductor die mounted thereon (Step 501). Such substrate can be of an ordinary variety as is commonly employed by those having ordinary skill in the art. The semiconductor die can comprise any type of die mounted integrated circuit (IC) device. One non-limiting example includes a microprocessor. Typically, the die is attached and electrically connected with the substrate by using a reflow process that attaches the die to the substrate using solder bumps of the die. In many implementations, the substrate includes a stiffener. A multilayer heat transfer element is provided for use by the method (Step 503). Many such embodiments of a multilayer heat transfer element are discussed in this patent. In one embodiment, the multilayer heat transfer element includes a core portion having a first layer of thermally conductive reflowable material formed on the top surface of the core. Also, a second layer of thermally conductive reflowable material is formed on the bottom surface of the core. The core and layers of thermally conductive reflowable material have been disclosed herein. The multilayer heat transfer element is positioned on the die (Step 505). One of the layers of thermally conductive reflowable material is placed in contact with the die. A heat spreader is then positioned on the package (Step 507). In particular, the heat spreader is typically placed in physical contact with one of the layers of thermally conductive reflowable material of the multilayer heat transfer element. In those embodiments that include a stiffener on the substrate, the multilayer heat transfer element can be conveniently placed on the stiffener if desired. Typically, but not exclusively, this sub-assembly can then be placed on a circuit board (e.g., a PCB (printed circuit board)) if desired. Where the substrate includes a plurality of solder balls arranged on a backside surface this has certain advantages that will be discussed below. The sub-assembly (and alternatively the sub-assembly and circuit board) is then subjected to a reflow process (Step 509). This reflow establishes thermal conduction between the die and the heat spreader through the multilayer heat transfer element. Such reflow can adhere a layer of thermally conductive reflowable material with the die and adhere another layer of thermally conductive reflowable material with the heat spreader. This establishes thermal communication between the die and the heat spreader (through the multilayer heat transfer element). In some embodiments, this reflow process can be used to simultaneously establish thermal communication between the die and the heat spreader (by reflowing a layer of thermally conductive reflowable material with the die and reflowing another layer of thermally conductive reflowable material with the heat spreader) and attach the package to the circuit board by reflowing the solder balls of the substrate. Thus, in such embodiments a process flow can be simplified by combining the process of establishing thermal contact between the die and heat spreader with the process of attaching the package to the circuit board. In some embodiments, this reflow process can facilitate the flowing of the layers of thermally conductive reflowable material into vias of a core to improve thermal conduction in the multilayer heat transfer element.

FIG. 6 is a flow diagram 600 illustrating a simplified method embodiment used for forming a multilayer heat transfer element that includes a core portion with a top surface and a bottom surface wherein the top surface includes a first layer comprised of a thermally conductive reflowable material and wherein the bottom surface includes a second layer comprised of a thermally conductive reflowable material. The method involves providing a thin sheet (plate) of core material having a top surface and a bottom surface (Step 601). For example a sheet of thin material is provided. In one embodiment a thin layer (15 µm) of copper is provided. However, the reader is reminded that the full range of materials and thicknesses disclosed herein can be provided. Additionally, such cores can have vias or dimples formed therein. A first layer of thermally conductive reflowable material is formed on the top surface of the core (Step 603). Such layers can be formed using a wide range of processes used to forms such layers. Examples include, but are not limited to screen printing, deposition, and HASL processes. Where the core is formed of conducting material, electroplating can also be used. Similarly, a second layer is formed on the bottom surface of the core material (Step 605). Again, as with the first layer, the second layer is comprised of thermally conductive reflowable materials. Once the sheet (or plate) of multilayer heat transfer materials is formed, it is singulating into a plurality of individual multilayer heat transfer elements which can be employed in accordance with the various embodiments of the invention (Step 607).

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A semiconductor package comprising:
    a packaging substrate;
    a semiconductor die having a top surface and a bottom surface having its bottom surface mounted on the substrate using solder balls;
    a heatspreader mounted at the top surface of the package; and
    a multi-layer heat transfer element arranged between the semiconductor die and the heat spreader to enable thermal communication between the die and the heat spreader wherein the multi-layer heat transfer element includes:
    a core spacer plate having a top surface and a bottom surface wherein the core spacer is arranged solely between the die and the heatspreader;
    a first layer of thermally conductive reflowable material formed ante top surface of the core and directly above the die configured to attach the core to the heatspreader, wherein the reflowable materials comprises a solder from the group consisting of silver containing solders, tin containing solders, lead containing solders, silicon titanium containing solders, tin silver containing solders, and tin bismuth containing solders; and
    a second layer of thermally conductive reflowable material formed on the bottom surface of the core to attach the core to the top surface of the die, wherein the reflowable materials comprises a solder selected from the group consisting of silver containing solders, tin containing solders, lead containing solders, silicon titanium containing solders, tin silver containing solders, and tin bismuth containing solders.

2. The package of claim 1 wherein the die is attached to the second layer by a reflow process and wherein the heat spreader is attached to the first layer by the reflow process.

3. The package of claim 1 wherein the core spacer plate is comprised of conducting materials.

4. The package of claim 1 wherein the core spacer plate is comprised of metal.

5. The package of claim 1 wherein the core spacer plate is comprised of layers of metal.

6. The package of claim 1 wherein the core spacer plate includes vias that penetrate through the core spacer plate.

7. The package of claim 1 wherein the core spacer plate includes dimples formed therein.

8. The package of claim 1 wherein the core spacer plate is comprised of a conducting resin material.

9. The package of claim 1 wherein the semiconductor die is mounted to the packaging substrate using a plurality of solder bumps;
    wherein the packaging substrate includes a stiffener element that is mounted between the heat spreader and the substrate.

10. The package of claim 1 wherein the first layer is formed of a solder material that has good adhesion to a material comprising a surface of the heat spreader; and
    wherein the second layer is formed of a solder material that has good adhesion to a material comprising atop surface of the die.

11. The package of claim 1 wherein the core spacer plate comprises a thermally non-conductive material and wherein the core spacer plate includes a plurality of vias that penetrate through the core spacer plate;
    wherein reflowable material of at least one of the first layer and the second layer fills at least a portion of the visa so that said first layer and the second layer are in physical contact with each other, thereby establishing thermal communication between the die and the heat spreader.

12. The package of claim 1 wherein a backside of the packaging substrate has a plurality of solder balls configured for attaching and electrically connecting the package with a circuit board; and
    wherein a reflow process is used to attach the heat spreader to the first layer, to attach the second layer to the die, and to attach the solder balls of the substrate to the circuit board.

13. The package of claim 1 wherein the multi-layer heat transfer element is between about 15 microns to about 150 microns thick.

14. The package of claim 13 wherein the first layer of thermally conductive reflowable material is between about 1 micron to about 10 microns tick; and
    wherein the second layer of thermally conductive reflowable material is between about 1 micron to about 10 microns thick.

15. The package of claim 13 wherein the multi-layer heat transfer element is less than about 30 microns thick.

* * * * *